US010988635B2

(12) United States Patent
Kraft et al.

(10) Patent No.: US 10,988,635 B2
(45) Date of Patent: *Apr. 27, 2021

(54) COMPOSITION AND METHOD FOR COPPER BARRIER CMP

(71) Applicant: Cabot Microelectronics Corporation, Aurora, IL (US)

(72) Inventors: Steven Kraft, Plainfield, IL (US); Fernando Hung Low, Aurora, IL (US); Roman A. Ivanov, Aurora, IL (US); Steven Grumbine, Aurora, IL (US)

(73) Assignee: CMC Materials, Inc., Aurora, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/208,797

(22) Filed: Dec. 4, 2018

(65) Prior Publication Data
US 2020/0172762 A1 Jun. 4, 2020

(51) Int. Cl.
*C09G 1/02* (2006.01)
*H01L 21/321* (2006.01)
*H01L 21/306* (2006.01)
*H01L 21/3105* (2006.01)
*H01L 21/3215* (2006.01)

(52) U.S. Cl.
CPC ............ *C09G 1/02* (2013.01); *H01L 21/30625* (2013.01); *H01L 21/3212* (2013.01); *H01L 21/31055* (2013.01); *H01L 21/32155* (2013.01)

(58) Field of Classification Search
CPC . C09G 1/02; H01L 21/30625; H01L 21/3212; H01L 21/32155; H01L 21/31055
USPC .................. 252/79.1; 438/690–693
See application file for complete search history.

(56) References Cited

U.S. PATENT DOCUMENTS

| 9,382,450 | B2 * | 7/2016 | Belmont ............... B82Y 30/00 |
| 9,556,363 | B2 | 1/2017 | Fu et al. |
| 2009/0215269 | A1 * | 8/2009 | Boggs ................... C09G 1/02 438/693 |
| 2014/0363973 | A1 | 12/2014 | Kanamaru et al. |
| 2015/0102012 | A1 | 4/2015 | Reiss et al. |
| 2018/0043497 | A1 * | 2/2018 | Hanano ................ B24B 37/00 |
| 2019/0106596 | A1 * | 4/2019 | Mishra ............. H01L 21/31053 |

OTHER PUBLICATIONS

Korean Intellectual Property Office Acting as ISA, International Search Report and Written Opinion of the International Searching Authority issued in connection with Application No. PCT/US2019/061267 dated Mar. 10, 2020.

* cited by examiner

*Primary Examiner* — Duy Vu N Deo
(74) *Attorney, Agent, or Firm* — Thomas Omholt; Erika R. Singleton; Christopher C. Streinz

(57) ABSTRACT

A chemical mechanical polishing composition for polishing a substrate having copper, barrier, and dielectric layers includes a water based liquid carrier, cationic silica abrasive particles dispersed in the liquid carrier, and a triazole compound, wherein the polishing composition has a pH of greater than about 6 and the cationic silica abrasive particles have a zeta potential of at least 10 mV. The triazole compound is not benzotriazole or a benzotriazole compound. A method for chemical mechanical polishing a substrate including copper, barrier, and dielectric layers includes contacting the substrate with the above described polishing composition, moving the polishing composition relative to the substrate, and abrading the substrate to remove a portion of the copper, barrier, and dielectric layers from the substrate and thereby polish the substrate.

22 Claims, No Drawings

COMPOSITION AND METHOD FOR COPPER BARRIER CMP

BACKGROUND OF THE INVENTION

Copper interconnect and dual damascene processes are back end of the line (BEOL) processes that have long been employed to form the network of metal wires that connect the transistors in a conventional semiconductor device. In these processes copper metal is deposited in openings formed in a dielectric material (e.g., TEOS). Tantalum and/or tantalum nitride are commonly used as barrier layers between the copper and dielectric materials. CMP processes are used to remove the excess copper and barrier layers from the surface of the dielectric to form the copper interconnects.

Copper CMP processes generally employ two or more polishing steps, the first of which is intended to remove most of the copper overburden and a subsequent (e.g., second or third) step that is intended to remove the barrier material and thereby expose the underlying dielectric layer. Advanced node copper barrier CMP operations have stringent planarity requirements. These planarity requirements can sometimes be met via the use of non-selective slurries that polish the copper, barrier, and dielectric layers at similar low removal rates. Such slurries commonly employ a hydrogen peroxide oxidizer and a relatively high loading of abrasive particles (e.g., about 5 weight percent).

The use of hydrogen peroxide can be problematic in that it tends to reduce the pot life of the slurry formulation (e.g., by decomposing and reacting with organic components in the slurry). Hydrogen peroxide can also accelerate corrosion of the copper interconnects. The use of high abrasive loading (concentration) increases cost of ownership by increasing the cost of the slurry.

As is well known in the art, the semiconductor industry is subject to continuing and severe downward pricing pressure. Such pricing pressure poses a challenge to the slurry formulator as the pressure to reduce costs often conflicts with the required performance metrics. For example, slurry costs may be reduced by reducing abrasive loading. However, in certain applications reducing the abrasive loading can severely and negatively impact the performance of the slurry. There is a real need in the industry for a copper barrier slurry formulation that reduces overall costs without sacrificing performance.

BRIEF SUMMARY OF THE INVENTION

A chemical mechanical polishing composition for polishing a substrate having a copper and/or barrier layer is disclosed. The polishing composition comprises, consists essentially of, or consists of a water based liquid carrier, cationic silica abrasive particles dispersed in the liquid carrier, the cationic silica abrasive particles having a zeta potential of at least 10 mV in the polishing composition, a triazole compound, wherein the triazole compound is not benzotriazole or a benzotriazole compound, and wherein the polishing composition has a pH of greater than about 6. In one embodiment, the silica abrasive particles include colloidal silica particles and the triazole compound includes a triazole pyridine compound such as 1H-1,2,3-Triazolo[4,5-b] pyridine. A method for chemical mechanical polishing a substrate including copper, barrier, and dielectric layers is further disclosed. The method may include contacting the substrate with the above described polishing composition, moving the polishing composition relative to the substrate, and abrading the substrate to remove a portion of the copper, barrier, and dielectric layers from the substrate and thereby polish the substrate.

DETAILED DESCRIPTION OF THE INVENTION

A chemical mechanical polishing composition for polishing a substrate having a copper and/or barrier layer is disclosed. The polishing composition comprises, consists essentially of, or consists of a water based liquid carrier, cationic silica abrasive particles dispersed in the liquid carrier, and a triazole compound. The polishing composition has a pH of greater than about 6 and the cationic silica abrasive particles have a zeta potential of at least 10 mV in the polishing composition. The triazole compound is not benzotriazole or a benzotriazole compound. In one embodiment, the silica abrasive particles include colloidal silica particles treated with an aminosilane compound and the triazole compound comprises a triazole pyridine compound such as 1H-1,2,3-Triazolo[4,5-b] pyridine.

The disclosed CMP compositions may be advantageously utilized for copper buff and/or barrier CMP operations (also referred to as copper barrier CMP operations). In such CMP operations it may be desirable for the polishing rates of copper, dielectric, and barrier layers to be similar. It will be appreciated, however, that the disclosed embodiments are not limited in this regard. Nor are the disclosed embodiments limited to copper buff and/or copper barrier operations, but may be utilized in substantially any suitable copper CMP operation.

The polishing composition contains an abrasive including metal oxide particles suspended in a liquid carrier. The abrasive may include substantially suitable metal oxide particles, for example, including colloidal silica particles and/or fumed silica particles. As used herein the term colloidal silica particles refers to silica particles that are prepared via a wet process rather than a pyrogenic or flame hydrolysis process which commonly produces structurally different particles. Such colloidal silica particles may be aggregated or non-aggregated. Non-aggregated particles are individually discrete particles that may be spherical or nearly spherical in shape, but can have other shapes as well (such as generally elliptical, square, or rectangular cross-sections). Aggregated particles are particles in which multiple discrete particles are clustered or bonded together to form aggregates having generally irregular shapes.

Colloidal silica may be precipitated or condensation-polymerized silica, which may be prepared using any method known to those of ordinary skill in the art, such as by the sol gel method or by silicate ion-exchange. Condensation-polymerized silica particles are often prepared by condensing $Si(OH)_4$ to form substantially spherical particles. The precursor $Si(OH)_4$ may be obtained, for example, by hydrolysis of high purity alkoxysilanes, or by acidification of aqueous silicate solutions. Such abrasive particles may be prepared, for example, in accordance with U.S. Pat. No. 5,230,833 or may be obtained from any of a number of commercial suppliers, for example, including EKA Chemicals, Fuso Chemical Company, Nalco, DuPont, Bayer, Applied Research, Nissan Chemical, and Clariant.

Pyrogenic silica is produced via a flame hydrolysis process in which a suitable feedstock vapor (such as silicon tetra-chloride) is combusted in a flame of hydrogen and oxygen. Molten particles of roughly spherical shapes are formed in the combustion process, the diameters of which may be varied via process parameters. These molten spheres, commonly referred to as primary particles, fuse with one another by undergoing collisions at their contact points to form branched, three-dimensional chain-like aggregates. Fumed silica abrasives are commercially available from a number of suppliers including, for example, Cabot Corporation, Evonic, and Wacker Chemie.

The abrasive particles may have substantially any suitable particle size. The particle size of a particle suspended in a liquid carrier may be defined in the industry using various means. For example, the particle size may be defined as the diameter of the smallest sphere that encompasses the particle and may be measured using a number of commercially available instruments, for example, including the CPS Disc Centrifuge, Model DC24000HR (available from CPS Instruments, Prairieville, La.) or the Zetasizer® available from Malvern Instruments®. The abrasive particles may have an average particle size of about 5 nm or more (e.g., about 10 nm or more, about 20 nm or more, or about 30 nm or more). The abrasive particles may have an average particle size of about 200 nm or less (e.g., about 160 nm or less, about 140 nm or less, about 120 nm or less, or about 100 nm or less). It will thus be understood that the abrasive particles may have an average particle size in a range bounded by any two of the aforementioned endpoints. For example, the abrasive particles may have an average particle size in a range from about 5 nm to about 200 nm (e.g., from about 10 nm to about 160 nm, from about 20 nm to about 140 nm, from about 20 nm to about 120 nm, or from about 20 nm to about 100 nm).

The polishing composition may include substantially any suitable amount of the abrasive particles. If the polishing composition comprises too little abrasive, the composition may not exhibit a sufficient removal rate. In contrast, if the polishing composition comprises too much abrasive, then the polishing composition may exhibit undesirable polishing performance and/or may not be cost effective and/or may lack stability. The polishing composition may include about 0.01 wt. % or more abrasive particles (e.g., about 0.05 wt. % or more). The polishing composition may include about 0.1 wt. % or more (e.g., about 0.2 wt. % or more, about 0.3 wt. % or more, or 0.5 wt. % or more) abrasive particles. The concentration of abrasive particles in the polishing composition is generally less than about 20 wt. %, and more typically about 10 wt. % or less (e.g., about 5 wt. % or less, about 3 wt. % or less, about 2 wt. % or less, or about 1.5 wt. % or less, or about 1 wt. % or less). It will be understood that the abrasive particles may be present in the polishing composition at a concentration bounded by any two of the aforementioned endpoints. For example, the concentration of abrasive particles in the polishing composition may be in a range from about 0.01 wt. % to about 20 wt. %, and more preferably from about 0.05 wt. % to about 10 wt. % (e.g., from about 0.1 wt. % to about 5 wt. %, from about 0.1 wt. % to about 3 wt. %, from about 0.1 wt. % to about 2 wt. %, from about 0.2 wt. % to about 2 wt. %, from about 0.2 wt. % to about 1.5 wt. %, or from about 0.2 wt. % to about 1 wt. %).

In embodiments in which the abrasive particles comprise silica (such as colloidal or pyrogenic silica) the silica particles may have a positive charge in the polishing composition. The charge on dispersed particles such as silica particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). Accordingly, silica abrasive particles with a positive charge (i.e., cationic silica abrasive particles) will have a positive zeta potential at their operating pH. The zeta potential is typically dependent on the pH of the aqueous medium. For a given composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of dispersed abrasive particles, such as in the disclosed polishing compositions, may be obtained using commercially available instrumentation such as the Zetasizer available from Malvern Instruments, the ZetaPlus Zeta Potential Analyzer available from Brookhaven Instruments, and/or an electro-acoustic spectrometer available from Dispersion Technologies, Inc.

In certain embodiments, the cationic silica abrasive particles have an isoelectric point greater than pH 7. For example, the abrasive particles may have an isoelectric point greater than pH 8 (e.g., greater than pH 8.5 or greater than pH 9). As described in more detail below the abrasive particles may optionally comprise colloidal silica particles treated with a nitrogen containing compound such as an aminosilane compound.

In certain embodiments, the cationic silica abrasive particles have a zeta potential of about 10 mV or more (e.g., about 15 mV or more, about 20 mV or more, about 25 mV or more, or about 30 mV or more) in the polishing composition (e.g., at a pH greater than about 6 or at a pH in a range from about 6 to about 8). The cationic silica abrasive particles may have a zeta potential of about 50 mV or less (e.g., about 45 mV or less or about 40 mV or less) in the polishing composition (e.g., at a pH greater than about 6 or at a pH in a range from about 6 to about 8). It will be understood that the cationic silica abrasive particles may have a zeta potential in a range bounded by any two of the aforementioned endpoints. For example, the cationic silica abrasive particles may have a zeta potential in a range from about 10 mV to about 50 mV (e.g., about 10 mV to about 45 mV, or about 20 mV to about 40 mV) in the polishing composition (e.g., at a pH greater than about 6 or at a pH in a range from about 6 to about 8).

In certain embodiments, the cationic silica abrasive particles may comprise colloidal silica particles treated with an aminosilane compound such that the treated abrasive particles have a zeta potential of about 10 mV or more (e.g., about 15 mV or more, about 20 mV or more, about 25 mV or more, or about 30 mV or more) in the polishing composition (e.g., at a pH greater than about 6, greater than about 7, greater than about 7.5, or greater than about 8). In certain of these embodiments, the abrasive particles comprise colloidal silica particles treated with a quaternary aminosilane compound. Such cationic colloidal silica particles may be obtained, for example, via treating the particles with at least one aminosilane compound as disclosed in commonly assigned U.S. Pat. Nos. 7,994,057 and 9,028,572 or in U.S. Pat. No. 9,382,450, each of which is incorporated by reference herein in its entirety. Colloidal silica particles having a zeta potential of about 10 mV or more in the polishing composition may also be obtained by incorporating a chemical species, such as an aminosilane compound, in the colloidal silica particles as disclosed in in commonly assigned U.S. Pat. No. 9,422,456, which is fully incorporated by reference herein.

It will be understood that that example cationic colloidal silica particles may be treated using any suitable treating method to obtain the cationic colloidal silica particles. For example, a quaternary aminosilane compound and the colloidal silica may be added simultaneously to some or all of the other components in the polishing composition. Alternatively, the colloidal silica may be treated with the quaternary aminosilane compound (e.g., via a heating a mixture of the colloidal silica and the aminosilane) prior to mixing with the other components of the polishing composition.

In certain embodiments, the cationic silica abrasive particles may have a permanent positive charge. By permanent positive charge it is meant that the positive charge on the silica particles is not readily reversible, for example, via flushing, dilution, filtration, and the like. A permanent positive charge may be the result, for example, of covalently bonding a cationic compound with the colloidal silica. A permanent positive charge is in contrast to a reversible positive charge that may be the result, for example, of an electrostatic interaction between a cationic compound and the colloidal silica.

Notwithstanding, as used herein, a permanent positive charge of at least 10 mV means that the zeta potential of the colloidal silica particles remains above 10 mV after the following three step ultrafiltration test. A volume of the polishing composition (e.g., 200 ml) is passed through a Millipore Ultracell regenerated cellulose ultrafiltration disk (e.g., having a MW cutoff of 100,000 Daltons and a pore size of 6.3 nm). The remaining dispersion (the dispersion that is retained by the ultrafiltration disk) is collected and replenished to the original volume with pH adjusted deionized water. The deionized water is pH adjusted to the original pH of the polishing composition using a suitable inorganic acid such as nitric acid. This procedure is repeated for a total of three ultrafiltration cycles (each of which includes an ultrafiltration step and a replenishing step). The zeta-potential of the triply ultra-filtered and replenished polishing composition is then measured and compared with the zeta potential of the original polishing composition. This three step ultrafiltration test is described in further detail in Example 10 of commonly assigned U.S. Pat. No. 9,422,456, which is incorporated herein by reference in its entirety.

A liquid carrier is used to facilitate the application of the abrasive and any optional chemical additives to the surface of the substrate to be polished (e.g., planarized). The liquid carrier may be any suitable carrier (e.g., a solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The polishing composition is generally neutral having a pH in a range from about 5 to about 9. For example, the polishing composition may have a pH of about 6 or more (e.g., about 6.5 or more, about 7 or more, or about 7.5 or more) when measured at 1 atmosphere and 25 degrees C. The polishing composition may further have a pH about 9 or less (e.g., about 8 or less or about 7.5 or less). The polishing composition may thus have a pH in a range bounded by any two the above endpoints. For example, the pH may be in a range from about 6 to about 9 (e.g., from about 6 to about 8, from about 6.5 to about 8, from about 7 to about 8.5, or from about 7 to about 8). The pH of the polishing composition may be achieved and/or maintained by any suitable means. The polishing composition may include substantially any suitable pH adjusting agents or buffering systems. For example, suitable pH adjusting agents may include nitric acid, sulfuric acid, phosphoric acid, and the like as well as organic acids such as acetic acid and lactic acid. Suitable buffering agents may include phosphates, ammonium salts, and the like.

The polishing composition further includes an inhibitor of copper etching and/or corrosion. The copper inhibitor is intended to reduce the rate of dissolution (dissolving) of copper metal in the CMP composition. In certain embodiments, the copper inhibitor includes a triazole compound. Preferred triazole compounds include triazole pyridine (TAP) compounds such as 1H-1,2,3-Triazolo[4,5,b] pyridine, 1-Acetyl-1H-1,2,3-triazolo[4,5,b] pyridine, 3H-[1,2,3] Triazolo[4,5-c] pyridine, and 2-(1,2,4-Triazol-3-yl) pyridine. The most preferred copper inhibitor is 1H-1,2,3-Triazolo[4,5,b] pyridine. The structure of 1H-1,2,3-Triazolo [4,5,b] pyridine is shown below.

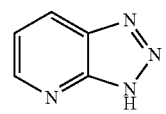

1H-1,2,3-Triazolo
[4,5,b] pyridine

While the copper inhibitor may include a triazole compound, such as a triazole pyridine compound, it will be understood that the copper inhibitor does not include benzotriazole or a benzotriazole compound (such as benzotriazole, 5-Methyl-1H-benzotriazole, or 1H-Benzotriazole-1-methanol). Benzotriazole (BTA) is a well-known and highly effective copper corrosion inhibitor that is commonly used in commercial copper CMP slurries. As shown in Example 1 below, BTA and certain BTA compounds may function as copper inhibitors in CMP polishing compositions. However, it has been found that the use of BTA or BTA compounds can be disadvantageous in CMP polishing compositions for at least the following reason. These compounds are believed to form an organic film that strongly adheres to the copper substrate (this film presumably inhibits copper corrosion). The presence of this strongly adhered film has been found to result in an abundance of organic surface residue defects on the wafer after the post CMP cleaning operation (as removal of the film has proven difficult). The surface defects have been observed to remain even after multiple post CMP cleaning steps using alkaline cleaners.

As described above, the copper inhibitor preferably includes a triazole pyridine compound. Those of ordinary skill in the art will readily understand that triazole pyridine compounds include a triazole group bonded to a pyridine ring. In certain embodiments, the pyridine ring and the triazole group share first and second carbon atoms (and are thus bonded together at the first and second carbon atoms). In contrast, benzotriazole compounds include a triazole group bonded to a benzene ring. Triazole pyridine compounds do not include a benzene ring.

The above disclosure that the copper inhibitor does not include benzotriazole or a benzotriazole compound is not intended to mean that the polishing composition must be free of benzotriazole or a benzotriazole compound. On the contrary, in embodiments including multiple triazole compounds it will be understood that at least one of the triazole compounds is not benzotriazole or a benzotriazole compound. For example, it will be understood that in certain embodiments the polishing composition may additionally include low levels of benzotriazole or a benzotriazole compound (e.g., less than 50 ppm, or less than 20 ppm, or less than 10 ppm, or even less than 5 ppm) in addition to the above-recited triazole compound copper inhibitor.

The amount of the copper inhibitor compound in the polishing composition may be varied depending upon the particular compound used, whether or not an oxidizing agent is used, the pH of the polishing composition, and other factors. When the preferred copper inhibitor is a triazole pyridine compound and the pH of the composition is neutral (e.g., from about 5 to about 9), the copper inhibitor may be present in the polishing composition in an amount ranging from about 10 to about 2000 ppm based on the total weight of the composition. In certain embodiments, the polishing composition may include about 10 ppm or more of the triazole pyridine compound (e.g., about 20 ppm or more, about 50 ppm or more, or about 100 ppm or more). The polishing composition may also include about 2000 ppm or less of the triazole pyridine compound (e.g., about 1000 ppm or less, about 700 ppm or less, or about 500 ppm or less). It will thus be understood that the triazole pyridine copper etch inhibitor may be present in the polishing composition at a concentration bounded by any two of the aforementioned endpoints. For example, the polishing composition may include from about 20 to about 1000 ppm of the triazole pyridine compound (e.g., from about 50 to about 1000 ppm, from about 50 to about 500, or from about 100 to about 500 ppm).

The polishing composition is preferably free of oxidizing agents that include a per-compound. In other words, it is preferred that per-compounds are not present in the polishing composition and are not intentionally added to the polishing composition. In such embodiments, the concentration of per-compound oxidizing agents in the polishing composition is essentially zero (e.g., less than 1 ppm by weight, less than 0.3 ppm by weight, or less than 0.1 ppm by weight). A per-compound as defined herein is a compound containing at least one peroxy group (—O—O—) or a compound containing a halogen element in its highest oxidation state. Examples of compounds containing at least one peroxy group include but are not limited to hydrogen peroxide and its adducts such as urea hydrogen peroxide, percarbonates, perborates, perboric acid, organic peroxides such as benzoyl peroxide, peracetic acid, and di-t-butyl peroxide, monopersulfates ($SO_5^-$), dipersulfates ($S_2O_8^-$), and sodium peroxide. Examples of compounds containing a halogen element in its highest oxidation state include but are not limited to periodic acid, periodate salts, perbromic acid, perbromate salts, perchloric acid, and perchlorate salts.

Per-compounds (including hydrogen peroxide and its adducts) are known to chemically react with triazole compounds including the aforementioned copper inhibitor compounds. Elimination of such per-compounds may therefore improve the chemical stability of the copper inhibitor and advantageously improve the pot life of the polishing composition.

The polishing composition may optionally (but does not necessarily) include an oxidizing agent that does not include a per compound (a non-per compound oxidizing agent). Such a non-per compound oxidizing agent may be selected from nitrogen containing organic oxidizers such as a nitro compound, a nitroso compound, an N-oxide compound, a hydroxylamine compound, an oxime compound, and combinations thereof. For example, the optional oxidizing agent may include an aryl nitro compound, an aryl nitroso compound, an aryl N-oxide compound, an aryl oxime compound, a heteroaryl nitro compound, a heteroaryl nitroso compound, a heteroaryl N-oxide compound, a heteroaryl oxime compound, and combinations thereof.

In optional embodiments including a non-per oxidizing agent, the oxidizing agent may be present in substantially any suitable concentration. The oxidizing agent may be present in the polishing composition at a concentration of about 0.5 mM or more, for example, about 1 mM or more, or about 2 mM or more. The oxidizing agent may also be present in the polishing composition at a concentration of about 100 mM or less, for example, about 50 mM or less, about 20 mM or less, about 10 mM or less. It will be understood that the oxidizing agent may be present in the polishing composition at a concentration bounded by any two of the aforementioned endpoints. For example, the oxidizing agent can be present in the polishing composition at a concentration in a range from about 0.5 mM to about 100 mM, (e.g., about 1 to about 50 mM, about 2 mM to about 50 mM, about 2 mM to about 20 mM, or about 2 mM to about 10 mM).

The polishing composition may optionally further include a biocide. The biocide may include any suitable biocide, for example an isothiazolinone biocide such as Kordek® biocides available from Dow Chemical Company. The polishing composition may include substantially any suitable amount of biocide. For example, certain embodiments may include from about 1 to about 1000 ppm of the biocide, for example, from about 10 to about 500 ppm. The disclosed embodiments are explicitly not limited to the use of any particular biocide compound or concentration.

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the abrasive particles, the copper inhibitor, etc.)

For example, colloidal silica and a quaternary aminosilane compound may be mixed in an aqueous liquid carrier. The mixture may optionally be heated (e.g., to a temperature of about 50 to 80 degrees C.) to promote bonding of the aminosilane compound to the colloidal silica. Other components such as a copper inhibitor and a biocide may then be added and mixed by any method that is capable of incorporating the components into the polishing composition. The polishing composition also may also be prepared by mixing the components at the surface of the substrate (e.g., on the polishing pad) during the CMP operation.

The polishing composition of the invention may also be provided as a concentrate which is intended to be diluted with an appropriate amount of water prior to use. In such an embodiment, the polishing composition concentrate may include abrasive particles, the copper inhibitor, the optional biocide, and water, in amounts such that, upon dilution of the concentrate with an appropriate amount of water each component of the polishing composition will be present in the polishing composition in an amount within the appropriate range recited above for each component. For example, abrasive particles and the copper inhibitor may be present in the polishing composition in an amount that is about 2 times (e.g., about 3 times, about 4 times, about 5 times, or about 10 times) greater than the concentration recited above for each component so that, when the concentrate is diluted with an equal volume of water (e.g., 1 equal volume of water, 2 equal volumes of water, 3 equal volumes of water, 4 equal volumes of water, or even 9 equal volumes of water respectively), each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

Although the polishing composition of the invention may be used to polish any substrate, the polishing composition is particularly useful for polishing a substrate comprising copper, a barrier layer such as tantalum and/or tantalum nitride, and at least one dielectric material. The dielectric layer may be a metal oxide such as a silicon oxide layer derived from tetraethyl orthosilicate (TEOS), porous metal oxide, porous or non-porous carbon doped silicon oxide, fluorine-doped silicon oxide, glass, organic polymer, fluorinated organic polymer, or any other suitable high or low-k insulating layer.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as the copper, the barrier layer, and the dielectric material as described herein) to polish the substrate.

In certain embodiments, optimal planarization may be achieved when the polishing rates of the copper, the barrier layer, and the dielectric material are similar. For example, in certain embodiments the selectivity of copper to dielectric material may be in a range from about 1:5 to about 5:1 (e.g., from about 1:3 to about 2:1). In certain embodiments, the polishing rate of the dielectric material may be greater than the polishing rate of copper such that the selectivity of copper to dielectric material may be less than 1:1 (e.g., in a range from 1:5 to about 1:1). The selectivity of copper to barrier layer may also be in a range from about 1:5 to about 5:1 (e.g., from about 1:3 to about 2:1).

A substrate can be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The invention is further illustrated by the following embodiments.

Embodiment (1) presents a chemical mechanical polishing composition for polishing a copper containing substrate, the polishing composition comprising: (i) a water based liquid carrier; (ii) cationic silica abrasive particles dispersed in the liquid carrier, the cationic silica abrasive particles having a zeta potential of at least 10 mV; (iii) a triazole compound, wherein the triazole compound is not benzotriazole or a benzotriazole compound; wherein the polishing composition has a pH of greater than 6.

Embodiment (2) presents a composition according to embodiment (1), wherein the triazole compound is a triazole pyridine compound.

Embodiment (3) presents a composition according to embodiment (2), wherein the triazole pyridine compound is 1H-1,2,3-Triazolo[4,5,b] pyridine, 1-Acetyl-1H-1,2,3-triazolo[4,5,b] pyridine, 3H-[1,2,3]Triazolo[4,5-c] pyridine, or 2-(1,2,4-Triazol-3-yl) pyridine.

Embodiment (4) presents a composition according to embodiment (2), wherein the triazole pyridine compound is 1H-1,2,3-Triazolo[4,5,b] pyridine.

Embodiment (5) presents a composition according to any one of embodiments (2)-(4), comprising from about 50 to about 500 ppm of the triazole pyridine compound.

Embodiment (6) presents a composition according to any one of embodiments (1)-(5), wherein the polishing composition is substantially free of a per-compound oxidizer.

Embodiment (7) presents a composition according to embodiments (6), further comprising an N-oxide compound oxidizer.

Embodiment (8) presents a composition according to any one of embodiments (1)-(7), having a pH from about 6 to about 8.

Embodiment (9) presents a composition according to any one of embodiments (1)-(8), wherein the cationic silica abrasive particles have an isoelectric point greater than about 9.

Embodiment (10) presents a composition according to any one of embodiments (1)-(9), wherein the cationic silica abrasive particles comprise colloidal silica particles having have a permanent positive charge of at least 20 mV at a pH of greater than 6.

Embodiment (11) presents a composition according to any one of embodiments (1)-(10), comprising less than about 2 weight percent of the cationic silica abrasive particles.

Embodiment (12) presents a method of chemical mechanical polishing a substrate having copper, barrier, and dielectric layers, the method comprising: (a) contacting the substrate with a polishing composition comprising: (i) a water based liquid carrier; (ii) cationic silica abrasive particles dispersed in the liquid carrier, the cationic silica abrasive particles having a zeta potential of at least 10 mV; (iii) a triazole compound, wherein the triazole compound is not benzotriazole or a benzotriazole compound; and wherein the polishing composition has a pH of greater than 6; (b) moving the polishing composition relative to the substrate; and (c) abrading the substrate to remove a portion of the copper layer from the substrate and thereby polish the substrate.

Embodiment (13) presents a method according to embodiment (12), wherein the triazole compound is a triazole pyridine compound.

Embodiment (14) presents a method according to embodiment (13), wherein the triazole pyridine compound is 1H-1,2,3-Triazolo[4,5,b] pyridine, 1-Acetyl-1H-1,2,3-triazolo[4,5,b] pyridine, 3H-[1,2,3]Triazolo[4,5-c] pyridine, or 2-(1,2,4-Triazol-3-yl) pyridine.

Embodiment (15) presents a method according to embodiment (13), wherein the triazole pyridine compound is 1H-1,2,3-Triazolo[4,5,b] pyridine.

Embodiment (16) presents a method according to any one of embodiments (13)-(15), wherein the polishing composition comprises from about 50 to about 500 ppm of the triazole pyridine compound.

Embodiment (17) presents a method according to any one of embodiments (12)-(16), wherein the polishing composition is substantially free of a per-compound oxidizer.

Embodiment (18) presents a method according to embodiment (17), wherein the polishing composition further comprises an N-oxide compound oxidizer.

Embodiment (19) presents a method according to any one of embodiments (12)-(18), wherein the polishing composition has a pH from about 6 to about 8.

Embodiment (20) presents a method according to any one of embodiments (12)-(19), wherein the cationic silica abrasive particles have an isoelectric point greater than about 9.

Embodiment (21) presents a method according to any one of embodiments (12)-(20), wherein the cationic silica abrasive particles comprise colloidal silica particles having a permanent positive charge of at least 20 mV at a pH of greater than 6.

Embodiment (22) presents a method according to any one of embodiments (12)-(21), comprising less than about 2 weight percent of the cationic silica abrasive particles.

Embodiment (23) presents a method according to any one of embodiments (12)-(22), wherein the barrier layer comprises a tantalum nitride layer and wherein the abrading in (c) also removes a portion of the tantalum nitride layer and the dielectric layer from the substrate.

Embodiment (24) presents a method according to embodiment (23), wherein removal rates of the tantalum nitride layer and the dielectric layer in (c) are greater than a removal rate of copper in (c).

Embodiment (25) presents a method according to embodiment (23), wherein the dielectric layer is tetraethyl orthosilicate (TEOS).

Embodiment (26) presents a chemical mechanical polishing composition for polishing a substrate having copper, barrier, and dielectric layers. The polishing composition comprises a water based liquid carrier, cationic silica abrasive particles dispersed in the liquid carrier, the cationic silica abrasive particles having a zeta potential of at least 10 mV in the polishing composition, a triazole pyridine compound, and wherein the polishing composition has a pH of greater than 6.

The following examples further illustrate the invention but, of course, should not be construed as in any way limiting its scope.

Example 1

Three polishing compositions were prepared (Controls A and B and Example composition 1). Each of the polishing compositions was prepared by adding an appropriate amount of cationic colloidal silica particles having an average particle size of 50 nm to a corresponding mixture such that the cationic colloidal silica had a final concentration of 0.5 weight percent. The cationic colloidal silica particles were prepared as described in Example 7 of U.S. Pat. No. 9,382,450. Each of the final compositions further included 2 mM Tris(hydroxymethyl)aminomethane and 100 ppm of Kordek MLX biocide at a pH of 7.1. Control B included 250 ppm of benzotriazol (BTA) and Example 1 included 250 ppm of the triazol pyridine compound H-1,2,3-Triazolo[4,5-b] pyridine. Each of the compositions (Controls A and B and Example 1) had a zeta potential of about 25 mV at pH 7.1.

The copper etch rate of each of the above-described polishing compositions was evaluated. To obtain the copper etch rate for each polishing composition, the polishing composition was first heated to 45 degrees C. after which a two-inch wafer having a copper layer was immersed in the polishing composition (copper side up) for 5 minutes. Copper removal rates were determined via resistivity measurements made before and after immersion in the polishing compositions. The copper etch rates are shown in Table 1.

TABLE 1

| Polishing Composition | Copper Inhibitor | Cu Etch Rate, Å/min |
|---|---|---|
| Control A | No inhibitor | 33 |
| Control B | Benzotriazole (BTA) | 0 |
| 1 | 1H-1,2,3-Triazolo[4,5-b] pyridine | 4 |

As is apparent from the results set forth in Table 1, Control B and Example 1 both exhibit a significantly reduced copper etch rate as compared to Control A. Example 1 demonstrates that triazol pyridine compounds may be effective copper corrosion inhibitors in CMP compositions having a neutral or near neutral pH.

Example 2

Copper, TEOS, TaN, and black diamond (BD) polishing rates were evaluated in this example for four polishing compositions. Control C was B7601 barrier slurry available from Cabot Microelectronics. Examples 2-4 were similar to Example 1 in that they included 0.5 weight percent of the cationic silica abrasive particles described above in Example 1, 2 mM Tris(hydroxymethyl)aminomethane, 250 ppm 1H-1,2,3-Triazolo[4,5-b] pyridine, and 100 ppm of Kordek MLX biocide at a pH of 7.1. No oxidizer was added to Example 2. Example 3 further included 5 mM of the organic oxidizer 4-nitropyridine-N-oxide (NPNO). Example 4 further included 1 weight percent hydrogen peroxide.

The copper, TEOS, TaN, and black diamond polishing rates were obtained by polishing corresponding blanket wafers. The wafers were polished using a Mirra® CMP polishing tool and a Fujibo H7000 polishing pad at a downforce of 1.5 psi, a platen speed of 93 rpm, and a head speed of 87 rpm. The slurry flow rate was 200 ml/min.

This example demonstrates that similar polishing rates can be achieved for each of the aforementioned layers using polishing compositions including triazole pyridine compound copper inhibitors with and without the addition of an oxidizer. The copper, TEOS, TaN, and black diamond polishing rates are shown in Table 2.

TABLE 2

| Polishing Composition | Cu Rate Å/min | TEOS Rate Å/min | TaN Rate Å/min | BD Rate Å/min |
|---|---|---|---|---|
| Control C | 156 | 394 | 690 | 570 |
| 2 | 190 | 389 | 302 | 305 |
| 3 | 239 | 366 | 272 | 320 |
| 4 | 58 | 348 | 315 | 335 |

As is apparent from the results set forth in Table 2, example polishing compositions 2 and 3 achieve similar polishing removal rates for copper, TEOS, TaN, and black diamond layers.

Example 3

Oxide erosion and line recessing (dishing) were evaluated in this example for each of the four polishing compositions evaluated in Example 2. The oxide erosion and line recessing values were obtained by polishing patterned wafers (Silyb MIT 854 mask—Cu BD 5.8 k 200 mm) in a 3-step polishing process using a Mirra® CMP polishing tool. Bulk copper was removed with a first polishing step (P1) using C8917 slurry and a D100 pad (both of which are available from Cabot Microelectronics) at a downforce of 3.2 psi, a platen speed of 85 rpm, and a head speed of 45 rpm. The P1 polish time was 45 seconds at a slurry flow rate of 180 ml/min. The second polishing step (P2) was a buff (or endpoint) process using the C8917 slurry and D100 pad at a downforce of 1.2 psi, a platen speed of 61 rpm, and a head speed of 60 rpm). The slurry flow rate was 200 ml/min. The third polishing step (P3) made use of the Control B and Example 2, 3, and 4 polishing compositions with a Fujibo H7000 polishing pad. The downforce was 1.5 psi, the platen speed 93 rpm, and the head speed 87 rpm. The slurry flow rate was 200 ml/min. Each patterned wafer was polished to an oxide removal of 300 Å calculated from the oxide blanket removal rate. The line recessing values were obtained using atomic force microscope (AFM) profilometer measurements across four distinct features: (i) 1×1 micron feature, (ii) a 10×10 micron feature, (iii) a 9×1 micron feature, and (iv) a 0.18×0.18 micron feature. The oxide erosion and line recessing values are shown in Table 3.

TABLE 3

| Polishing | Oxide Erosion (Å) | | | | Line Recessing (Å) | | | |
|---|---|---|---|---|---|---|---|---|
| Composition | 2 × 2 | 10 × 10 | 9 × 1 | 0.18 × 0.18 | 2 × 2 | 10 × 10 | 9 × 1 | 0.18 × 0.18 |
| Control B | 123 | 109 | 611 | 116 | 72 | 156 | −110 | 52 |
| 2 | 127 | 146 | 785 | 32 | 63 | 321 | 154 | 72 |
| 3 | 148 | 130 | 565 | 131 | 75 | 115 | −149 | 64 |
| 4 | 165 | 92 | 529 | 214 | 150 | 446 | 125 | 98 |

As is apparent from the results set forth in Table 3, polishing compositions 2, 3, and 4 achieve low oxide erosion and line recessing over a range of pattern types and densities.

Example 4

Copper cleanability was evaluated in this example. Two polishing compositions were evaluated (Control C and Example 5). Each composition included 0.5 weight percent of the cationic silica abrasive particles described above with respect to Example 1, 2 mM Tris(hydroxymethyl)aminomethane, 180 ppm of β-alanine, 5 mM NPNO, 100 ppm of Kordek MLX biocide, and 100 ppm copper corrosion inhibitor at a pH of 7.1. Control C included 100 ppm of BTA copper corrosion inhibitor while Example 5 included 100 ppm of 1H-1,2,3-Triazolo[4,5-b] pyridine copper corrosion inhibitor. Both compositions were used to polish copper wafers on a Mirra® polishing tool and a Fujibo H7000 polishing pad at a downforce of 1.5 psi, a platen speed of 93 rpm, and a head speed of 87 rpm. The slurry flow rate was 200 ml/min. Each copper wafer was polishing for 60 seconds. After polishing, the copper wafers were cleaned using K8160-1 (available from Cabot Microelectronics) in an ONTRAK cleaner for 60 seconds in each of 2 brush boxes. Defect counts were collected using a Surfscan SP1 at threshold of 0.16 μm. Defects images were collected using a scanning electron microscope and defect classification was completed through visual examination of the obtained images. The observed defects were predominately organic surface residue. The defect data are shown in Table 4.

TABLE 4

| Polishing Composition | Defects Counts |
|---|---|
| Control C | >40,000 |
| 5 | <300 |

As is apparent from the results set forth in Table 4, the use a triazole pyridine copper corrosion inhibitor results in fewer defects on the copper surface indicating that these compounds are more easily removed from the copper substrate in the post-CMP cleaning step. The use of a benzotriazole copper inhibitor resulted in a very large number of organic defects on the surface of the copper. The number of defects could not be reduced even with multiple post-CMP cleaning steps.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical mechanical polishing composition for polishing a substrate having copper, barrier, and dielectric layers, the polishing composition comprising:
   a water based liquid carrier;
   cationic silica abrasive particles dispersed in the liquid carrier, the cationic silica abrasive particles having a zeta potential of at least 10 mV in the polishing composition;
   a triazole compound, wherein the triazole compound is not benzotriazole or a benzotriazole compound; and
   wherein the polishing composition has a pH of greater than 6, and wherein the composition is substantially free of a per-compound oxidizer and further comprises an N-oxide compound oxidizer in a concentration of about 0.5 mM to about 100 mM.

2. The composition of claim 1, wherein the triazole compound is a triazole pyridine compound.

3. The composition of claim 2, wherein the triazole pyridine compound is 1H-1,2,3-Triazolo[4,5,b] pyridine, 1-Acetyl-1H-1,2,3-triazolo[4,5,b] pyridine, 3H-[1,2,3]Triazolo[4,5-c] pyridine, or 2-(1,2,4-Triazol-3-yl) pyridine.

4. The composition of claim 2, wherein the triazole pyridine compound is 1H-1,2,3-Triazolo[4,5,b] pyridine.

5. The composition of claim 2, comprising from about 50 to about 500 ppm of the triazole pyridine compound.

6. The composition of claim 1, having a pH from about 6 to about 8.

7. The composition of claim 1, wherein the cationic silica abrasive particles have an isoelectric point greater than about 9.

8. The composition of claim 1, wherein the cationic silica abrasive particles comprise colloidal silica particles having have a permanent positive charge of at least 20 mV at a pH of greater than 6.

9. The composition of claim 1, comprising less than about 2 weight percent of the cationic silica abrasive particles.

10. A method of chemical mechanical polishing a substrate having copper, harrier, and dielectric layers, the method comprising:
    (a) contacting the substrate with a polishing composition comprising:
        (i) a water based liquid carrier;
        (ii) cationic silica abrasive particles dispersed in the liquid carrier, the cationic silica abrasive particles having a zeta potential of at least 10 mV;
        (iii) a triazole compound, wherein the triazole compound is not benzotriazole or a benzotriazole compound; and
        wherein the polishing composition has a pH of greater than 6, and wherein the composition is substantially free of a per-compound oxidizer and further comprises an N-oxide compound oxidizer in a concentration of about 0.5 mM to about 100 mM;
    (b) moving the polishing composition relative to the substrate; and
    (c) abrading the substrate to remove a portion of the copper layer from the substrate and thereby polish the substrate.

11. The method of claim 10, wherein the triazole compound is a triazole pyridine compound.

12. The method of claim 11, wherein the triazole pyridine compound is 1H-1,2,3-Triazolo[4,5,b] pyridine, 1-Acetyl-1H-1,2,3-triazolo[4,5,b] pyridine, 3H-[1,2,3]Triazolo[4,5-c] pyridine, or 2-(1,2,4-Triazol-3-yl) pyridine.

13. The method of claim 11, wherein the triazole pyridine compound 1H-1,2,3-Triazolo[4,5,b] pyridine.

14. The method of claim 11, wherein the polishing composition comprises from about 50 to about 500 ppm of the triazole pyridine compound.

15. The method of claim 10, wherein the polishing composition has a pH from about 6 to about 8.

16. The method of claim 10, wherein the cationic silica abrasive particles have an isoelectric point greater than about 9.

17. The method of claim 10, wherein the cationic silica abrasive particles comprise colloidal silica particles having have a permanent positive charge of at least 20 mV at a pH of greater than 6.

18. The method of claim 10, comprising less than about 2 weight percent of the cationic silica abrasive particles.

19. The method of claim 10, wherein the barrier comprises a tantalum nitride layer and wherein the abrading in (c) also removes a portion of the tantalum nitride layer and the dielectric layer from the substrate.

20. The method of claim 19, wherein removal rates of the tantalum nitride layer and the dielectric layer in (c) are greater than a removal rate of copper in (c).

21. The method of claim 19, wherein the dielectric layer is tetraethyl orthosilicate (TEOS).

22. A chemical mechanical polishing composition for polishing a substrate having copper, barrier, and dielectric layers, the polishing composition comprising:
    a water based liquid carrier;
    cationic silica abrasive particles treated with an aminosilane compound, the cationic silica abrasive particles dispersed in the liquid carrier, the cationic silica abrasive particles having a zeta potential of at least 10 mV in the polishing composition;
    a triazole pyridine compound; and
    wherein the polishing composition has a pH of greater than 6, and wherein the composition is substantially free of a per-compound oxidizer and further comprises an N-oxide compound oxidizer in a concentration of about 0.5 mM to about 100 mM.

* * * * *